United States Patent
Schiller et al.

[19]

[11] Patent Number: 6,034,527
[45] Date of Patent: Mar. 7, 2000

[54] METHOD AND MEASURING APPARATUS FOR A CONTACTLESS LONGITUDINAL AND TRANSVERSAL HOMOGENEITY EXAMINATION OF CRITICAL CURRENT DENSITY IN SUPERCONDUCTOR TAPE

[75] Inventors: Heinz-Peter Schiller, Karlsruhe; Wolfgang Schauer, Pfinztal; Hans Reiner, Linkenheim-Hochstetten; Kai Grube, Karlsruhe, all of Germany; Milan Polak, Bratislava, Slovakia

[73] Assignee: Forschungszentrum Karlsruhe GmbH, Germany

[21] Appl. No.: 09/065,491

[22] Filed: Apr. 24, 1998

[30] Foreign Application Priority Data

Apr. 24, 1997 [DE] Germany .............. 197 17 283

[51] Int. Cl.$^7$ .............. G01N 27/72; G01R 33/12
[52] U.S. Cl. .............. 324/235; 324/225
[58] Field of Search .............. 324/235, 225, 324/251, 248, 234, 260, 262, 117 H; 338/32 H; 505/310, 842, 843, 160

[56] References Cited

U.S. PATENT DOCUMENTS 5,462,917 10/1995 Salama et al. .............. 505/500
5,543,768 8/1996 Murakami et al. .............. 335/216

*Primary Examiner*—Jay Patidar
*Attorney, Agent, or Firm*—Venable; Robert Kinberg

[57] ABSTRACT

A method and apparatus employs Hall probes for contactless, longitudinal and transversal homogeneity examination of a critical current density $j_c$ in a superconductor tape that is cooled to below a transition temperature $T_c$. The cooled superconductor tape is pulled through an external, locally limited magnetic field that has a constant gradient and a fixed magnetic field axis. The magnetic field generated by a screening current induced in a region of the superconductor tape penetrated by the external magnetic field is scanned using a first Hall probe at a distance of a few tenths of millimeters to the superconductor tape. The external magnetic field outside of a field range of the induced persistent currents is measured with a second Hall probe. A compensated difference between the first and second Hall probe signals is used as a qualitative measure for a critical current density $j_c(x)$ and its longitudinal homogeneity which varies locally with respect to a longitudinal axis of the superconductor tape. The compensated difference is formed by adjusting a test difference between the two Hall probe signals to zero as a result of measuring the external magnetic field by both Hall probes in a dummy measurement conducted without the superconductor tape. A transverse homogeneity with a linear Hall probe array that is positioned crosswise to the longitudinal axis of the superconductor tape and extends broadside over the superconductor tape is measured after all Hall probes in the array have first been adjusted to zero with a signal from the second probe. Quantitative locally critical current densities are specified from the Hall probe signals by a resistive calibration obtained from a current-voltage measurement.

15 Claims, 9 Drawing Sheets

METHOD AND MEASURING APPARATUS FOR A CONTACTLESS LONGITUDINAL AND TRANSVERSAL HOMOGENEITY EXAMINATION OF CRITICAL CURRENT DENSITY IN SUPERCONDUCTOR TAPE

CROSS-REFERENCE TO RELATED APPLICATIONS

Priority is claimed with respect to application No. 197 17 283.0 filed in Germany on Apr. 24, 1997, the disclosure of which is incorporated herein by reference.

BACKGROUND OF THE INVENTION

The invention relates to a method for determining the critical current density $j_c(x, y)$ and its homogeneity in a superconductor tape and a measuring apparatus for carrying out the method.

The measuring is carried out inductively and without contact in a cryostat, in which the superconductor tape is cooled below its transition temperature.

The state of the technology is a resistive measuring method, for example, with current fed into the superconductor tape and voltage contacts, either at the conductor ends for insulated tape conductors or with attached contacts or voltage taps by way of sliding contacts in the case of non-insulated superconductors. This is referred to as a contacting measuring method.

When compared to an inductive method, the resistive current density measuring has a decisive disadvantage in that the device to be tested must be contacted. Contact measuring is not only very involved, but additionally it is not very reliable since the Bi-2223 tape in particular is frequently coated with an organic layer, which has to be dissolved and causes non-reproducible transition resistances during the tapping. This is not suitable for a technical processing method.

Contactless methods must also be mentioned, that is to say the Hall probe magnetometry, such as is used for Y-123-sputtering films (see W. Xing et al.,"Magnetic Flux Mapping, . . .," in J. *Appl. Phs.*, 76(7), 1994, pp 4244–4255; and M. Polak et al.,"Contactless Measurement of Voltage-Current Characteristics . . .," in *Physica C*, 174 (1991), pp 14–22); and Bi-2223 single-core conductor tape segments (see Markku Lahtinen et al., "Homogeneity Study of Bi-2223/Ag Monofilamentary Tapes . . .," in *Physica C* 244 (1995), pp 115–122; A. Tanihata et al., "Scanning Hall Probe Microscopy . . . ," in *Supercond. Sci. Techn.* 9 (1996), pp 1055–1059; and K. Kawano and A. Oota, "A study on Self-Field Distribution . . . " in *Physica C* 275 (1997), pp 1–11). For the last-mentioned method, the fields of magnetized devices to be tested are tested with Hall probes. These contactless measuring methods measure the residual field distribution of short stationary samples (in the cm range), following the magnetizing in the external field, and its decay. In order to measure the residual field distribution, the device to be tested is scanned with the Hall probe employing an x-y shift table. The current density distribution is determined from the position-dependent Hall signal with the aid of a computer analysis. A pull-through method is described in *Siemens Forsch -u. Entwickl.-Ber.* [*Siemens Research and Development Report*], Volume 5 (1976), No. 2, pp 98–103, for which the magnetic field strength of a screening current is determined outside of the superconductor with Hall probes.

SUMMARY OF THE INVENTION

It is an object of the invention to provide a method and a measuring apparatus, which can be utilized industrially, to permit a continuous measuring of long sections of a superconductor tape with respect to the critical density $j_c(x, y)$ and its homogeneity over a length of the tape.

The above and other objects are accomplished according to the invention by the provision of a method using Hall probes for contactless, longitudinal and transversal homogeneity examination of a critical current density $j_c$ in a superconductor tape that is cooled to below a transition temperature $T_c$, comprising the steps of: pulling the cooled superconductor tape through an external, locally limited magnetic field B (x, y, z) that has a constant gradient and a fixed magnetic field axis; scanning a magnetic field generated by a screening current induced in a region of the superconductor tape penetrated by the external magnetic field using a first Hall probe at a distance of a few tenths of a millimeter to the superconductor tape, the first Hall probe producing a first Hall probe signal representing the scanned magnetic field; measuring the external magnetic field outside of a field range of the induced screening current with a second Hall probe which produces a second Hall probe signal representative of the measured external magnetic field; using a compensated difference between the first and second Hall probe signals as a qualitative measure for a critical current density $j_c(x)$ and its longitudinal homogeneity which varies locally with respect to a longitudinal axis of the superconductor tape; forming the compensated difference by adjusting a test difference between the two Hall probe signals to zero as a result of measuring the external magnetic field by both Hall probes in a dummy measurement conducted without the superconductor tape; measuring a transverse homogeneity with a linear Hall probe array that is positioned crosswise to the longitudinal axis of the superconductor tape and extends broadside over the superconductor tape after all Hall probes in the array have first been adjusted to zero with a signal from the second probe; and specifying quantitative locally critical current densities $j_c(x, y)$ from the Hall probe signals by a resistive calibration obtained from a current-voltage measurement.

According to another aspect of the invention there is provided an apparatus for contactless, longitudinal and transversal homogeneity examination of a critical current density $j_c$ in a superconductor tape that is cooled to below a transition temperature, comprising: a cryostat that can be filled with a cooling agent for adjusting and maintaining a temperature necessary for superconducting operation; a magnet located inside the cryostat and having two poles separated by a gap through which the superconductor tape can be pulled; a guide in a region of the gap for positioning the superconductor tape in the gap; two reversing rolls disposed inside the cryostat and being dimensioned and installed so that the superconductor tape is transferred to and taken up, undamaged, from the guide; a first Hall probe in a region of the gap between the poles of the magnet for detecting the magnetic field generated by a screening current induced in the superconductor tape by the magnet; a second Hall probe in the magnetic field generated by the magnet and located outside of the magnetic field generated by the induced screening current; a linear array of Hall probes installed crosswise to a longitudinal axis and parallel to a broadside of the superconductor tape to be pulled through the gap between the poles of the magnet; and a roll arrangement outside of the cryostat having a controllable angular velocity so that, in the region between poles of the magnet, the superconductor tape to be examined has a predetermined constant speed when moving in either a forward or backward direction.

In accordance with the invention, the measuring is contactless with Hall probes, or a Hall-probe array, directly below the continuous superconductor tape in the external magnetic field. With the aid of a single (compensation) Hall probe, in the external magnetic field, which probe is so far removed from the superconductor tape that the magnetic field generated by the screening current is no longer detected, or does not significantly contribute. One Hall probe, e.g. from the array, is sufficient to measure the longitudinal homogeneity. The transverse homogeneity is detected with the aid of all Hall probes in the array. The signal of all Hall probes of the array due to the external field is compensated using the single (compensation) Hall probe signal, so that the respective difference signal represents a measure of the localized homogeneity. The position-dependent, critical current density $j_c$ can be specified via a resistive calibration if the superconductor tape cross section is known.

The invention has the advantage of offering a fast and easy to handle method for determining current density homogeneity (TACHO=Test of Tape Current HQmogeneity) in a superconductor tape in the longitudinal and transverse directions. The method makes it possible to localize defective spots on the tape, which manifest themselves through a drop in the current carrying capacity on a millimeter scale. With a computer control for operation and data acquisition, a fully automatic quality control of superconductor tapes can be realized over the complete manufactured length which could be in the kilometer range.

BRIEF DESCRIPTION OF THE DRAWINGS

The method according to the invention and the apparatus for carrying out the method are explained in further detail in the following with the aid of the drawings.

DETAILED DESCRIPTION OF THE INVENTION

The method of the invention is carried out, according to one example, at 77° K (Kelvin) in magnetic fields of up to 0.1 T (Tesla). However, with a corresponding cryotechnical expenditure, this method can be expanded to other temperature ranges and magnetic field ranges as well.

Figure 1:
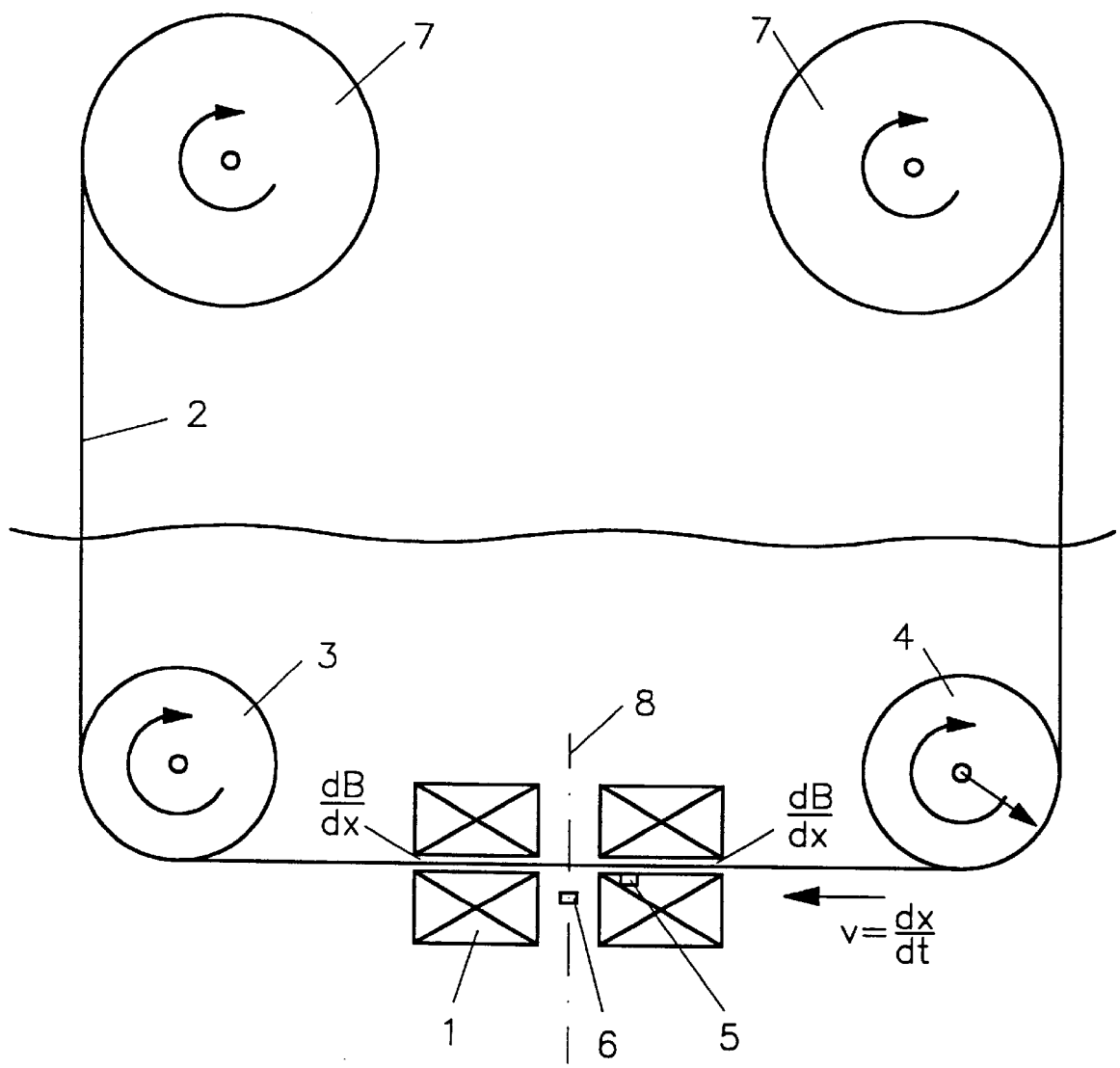
FIG. 1a is a schematic of a basic design of the measuring apparatus according to the invention.
FIG. 1b is a block circuit diagram of the measuring and computer control system.
FIG. 1c is an illustration of the guide of the superconductor tape in the split coil gap.
FIG. 1d is a sketch of the linear Hall probe array crossing the tape under investigation.
Figure 1A:
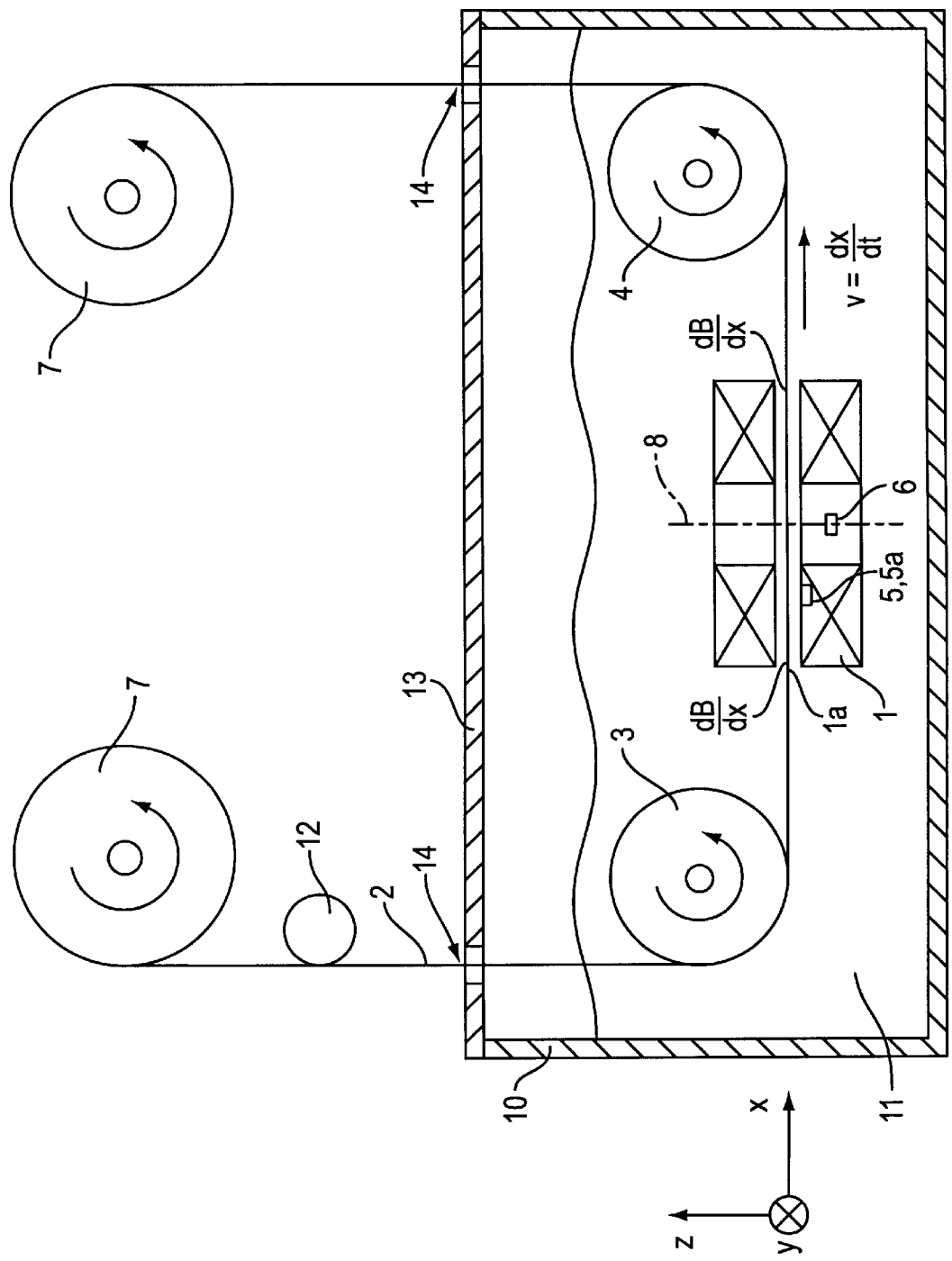

Referring to FIG. 1a, there is shown a superconductor tape 2 pulled at 77° K in a cryostat 10 with a speed of several mm/sec through a gap 1a of a magnet 1, here a copper coil with split-coil geometry. The cooling agent 11 in cryostat 10 is liquid nitrogen ($LN_2$). Superconductor tape 2 is guided by a motor-driven roll 7 through a cryostat cover 13 provided with narrow slits 14 for the entrance into and exit of the tape from cryostat 10. The pull-through speed and the ribbon position here are measured by an incremental transmitter 12. Inside cryostat 10, superconductor tape 2 is cooled by cooling liquid 11 to a temperature below the transition temperature and is guided via a deflection roll 3 into gap 1a of split coil solenoid magnet 1. Superconductor tape 2 is guided out of the magnet and cryostat via another deflection roll 4 and is wound around the motor-driven roll 7a. Preferably, the arrangement of rolls 7, 7a is such that the rolls can be moved horizontally to ensure that a long tape always enters and exits cryostat cover 13 vertically without friction at the slit edges. The magnetic field, which is perceived by the tape as changeable in time (dB/dt=(dB/dx)·(dx/dt), with dx/dt=v=pull-through speed of tape) induces a screening current in the superconductor tape 2, which flows with the critical current density, based on the model for the critical state. The screening current in turn generates a magnetic field, which in the case described here is measured with a miniature Hall probe 5 or Hall probe array 5a (see FIG. id) comprised of multiple probes 5 each having a 50 $\mu$m×50 $\mu$m active surface. Such probes are commercially available, for example, from AREPOC Ltd., Iljusinova 4, 85101 Bratislava, Slovakia. Probe 5 is positioned 0.4 mm below tape 2 in gap 1a below the coil winding, where the coil field has a mostly location-independent gradient dB/dx. This is a precondition for a magnetizing measurement to be carried out with a fixed electrical field E dB/dt=dB/dx·v, which is used to determine the critical current. In order to measure the sampling field for the screening current, which normally is <1 mT, the external coil field that is larger by up to three orders of magnitude, must be compensated. This is done with a second, compensation Hall probe 6, preferably of the same design, which is used for a zero adjustment of the difference signal from both Hall probes 5, 6 during a dummy measurement without the superconductor tape. This compensation Hall probe 6 is located outside of the field range for the screening current, for example, along central axis 8 of magnet 1. The difference signal from both probes 5, 6 is measured, which is different from zero if a superconductor tape is present.

Figure 1B:
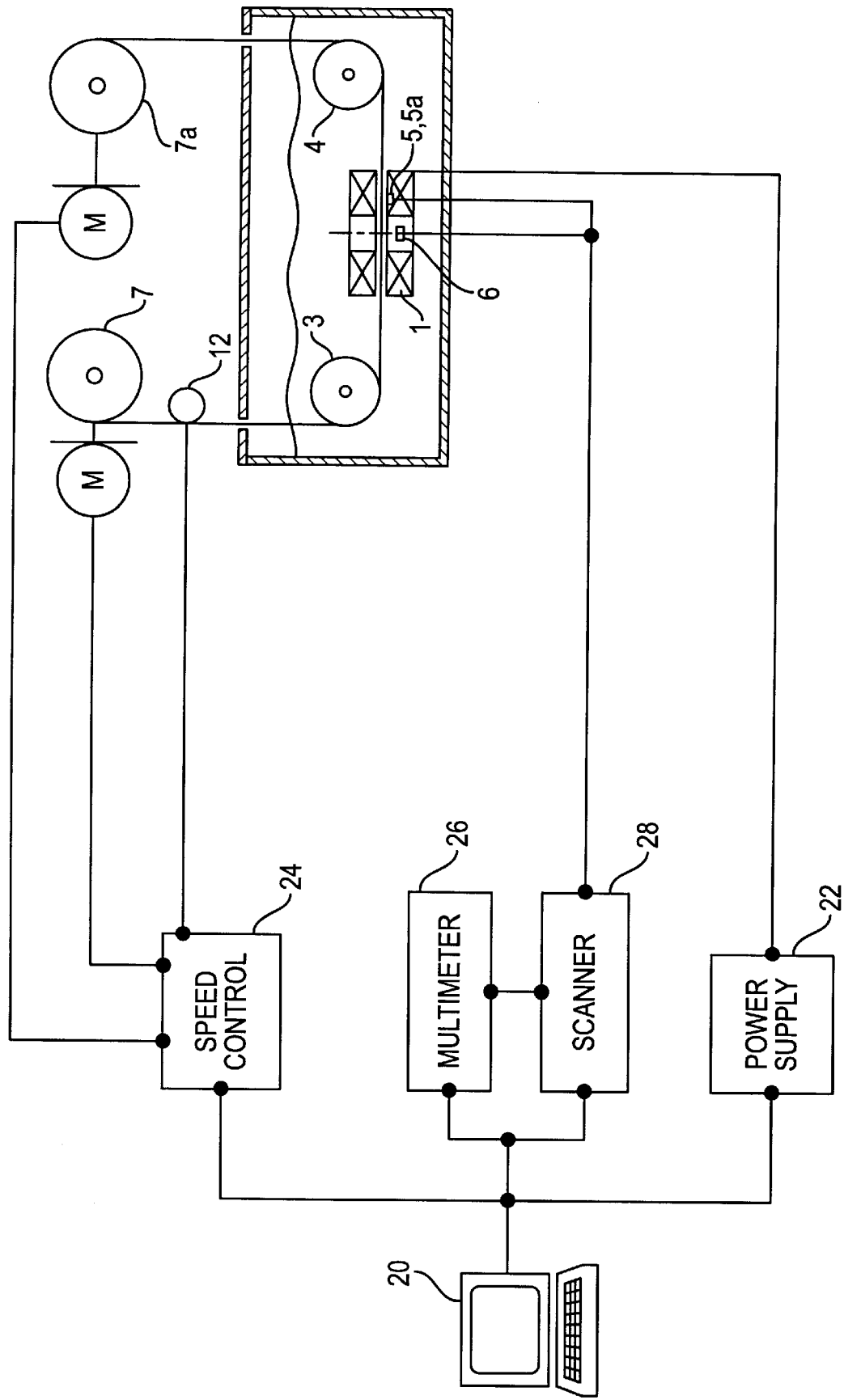

FIG. 1b is a block circuit diagram which shows the measuring electronics and the computer control system for the arrangement in FIG. 1a. A personal computer 20 controls a power supply unit 22 for operating magnet 1, a speed control 24 for controlling the speed of motors M of motor-driven rolls 7, 7a, the position measuring with the aid of incremental transmitter 12, and a multimeter 26 for measuring the voltage of the Hall probes. If a Hall probe array is used in place of a single Hall probe, then the Hall probes of the array are selected with a scanner 28.

Figure 1C:
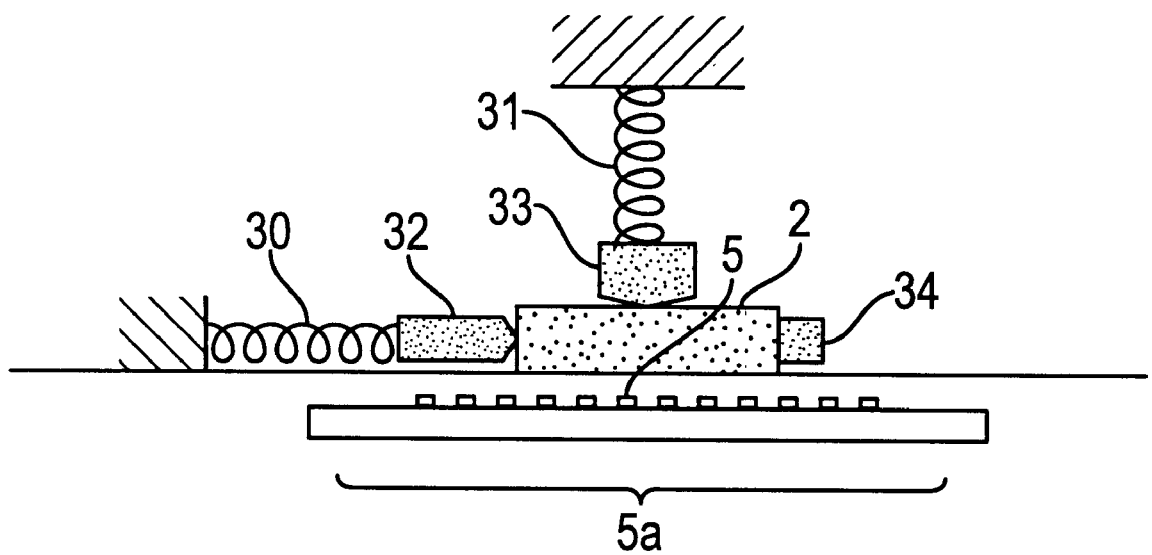

The exact positioning of the tape occurs with the aid of copper-beryllium springs 30, 31 and sapphire pistons 32–34 shown in FIG. 1c. The position of superconductor tape 2 is thus secured in two directions, perpendicular to the pull-through direction, in that copper beryllium springs 30, 31 press the conductor against the sapphire pistons 32, 33. Sapphire piston 34 is fixed.

Figure 1D:
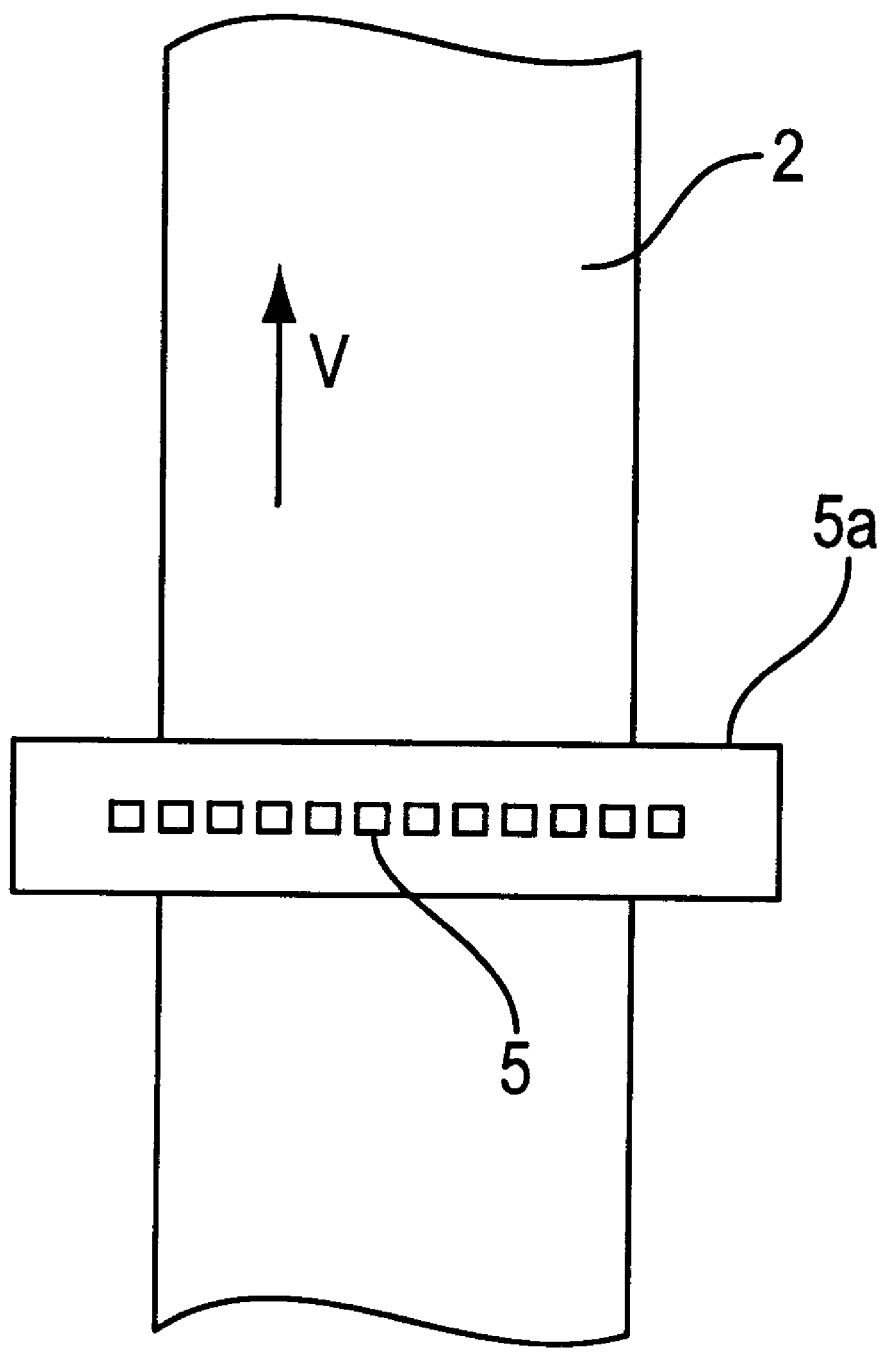

As shown in FIG. 1d, Hall probe array 5a is oriented perpendicular to the longitudinal axis of superconductor tape 2 and its pull-through direction. If only the homogeneity in the longitudinal direction is to be examined, then a single Hall probe 5 of the array is sufficient. It makes sense to use the center probe for this purpose. The distance between the tape and the Hall probe is critical and must remain constant at approximately 0.05 mm during passage of the tape.

Figure 4:
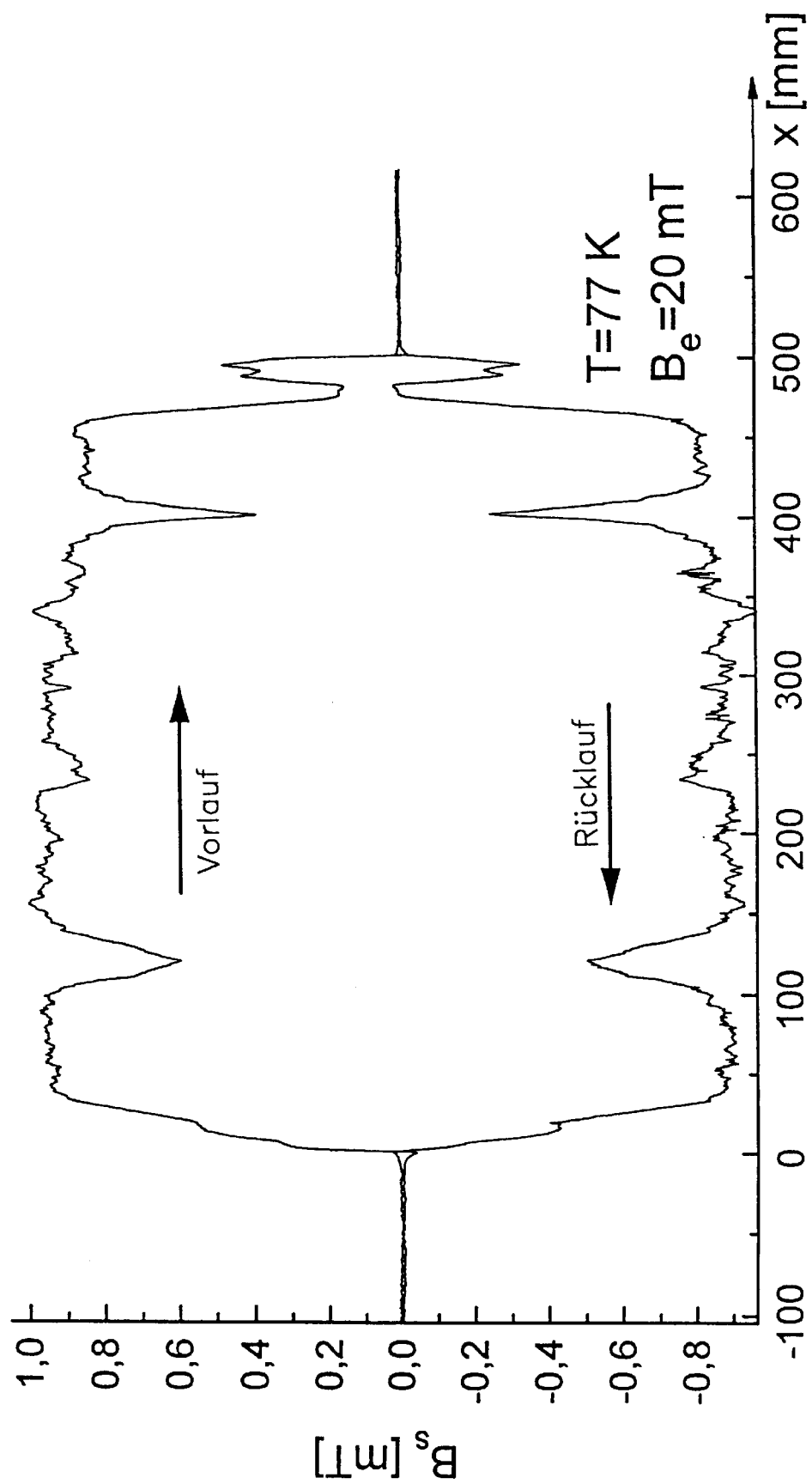
FIG. 4 is a diagram showing a mirror-symmetrical Hall signal during the reversal of the tape movement direction.

Variations of the distance >0.1 mm can be detected clearly in the Hall signal. FIG. 4 demonstrates that the required distance tolerance must be maintained, wherein an exact mirror-symmetrical Hall signal is recorded during the change in direction for the passage speed.

A displacement transducer (not shown) measures the tape position in the pulling direction.

The critical current density can be computed with an inversion method from the Hall probe difference signal by assuming a two-dimensional current distribution $j_c$ (x, y) in the tape plane, meaning a constant current density over the tape thickness (see W. Xing et al., supra.). With more complicated current distributions, such as the distribution in a superconducting multi-core conductor, the Hall probe signal provides a qualitative measure for the current density, which can detect inhomogeneities on a mm scale. Quantitative data can always be obtained through a resistive calibration, for which local current-voltage measurements are made on the superconductor to be tested (FIG. 3).

Figure 2:
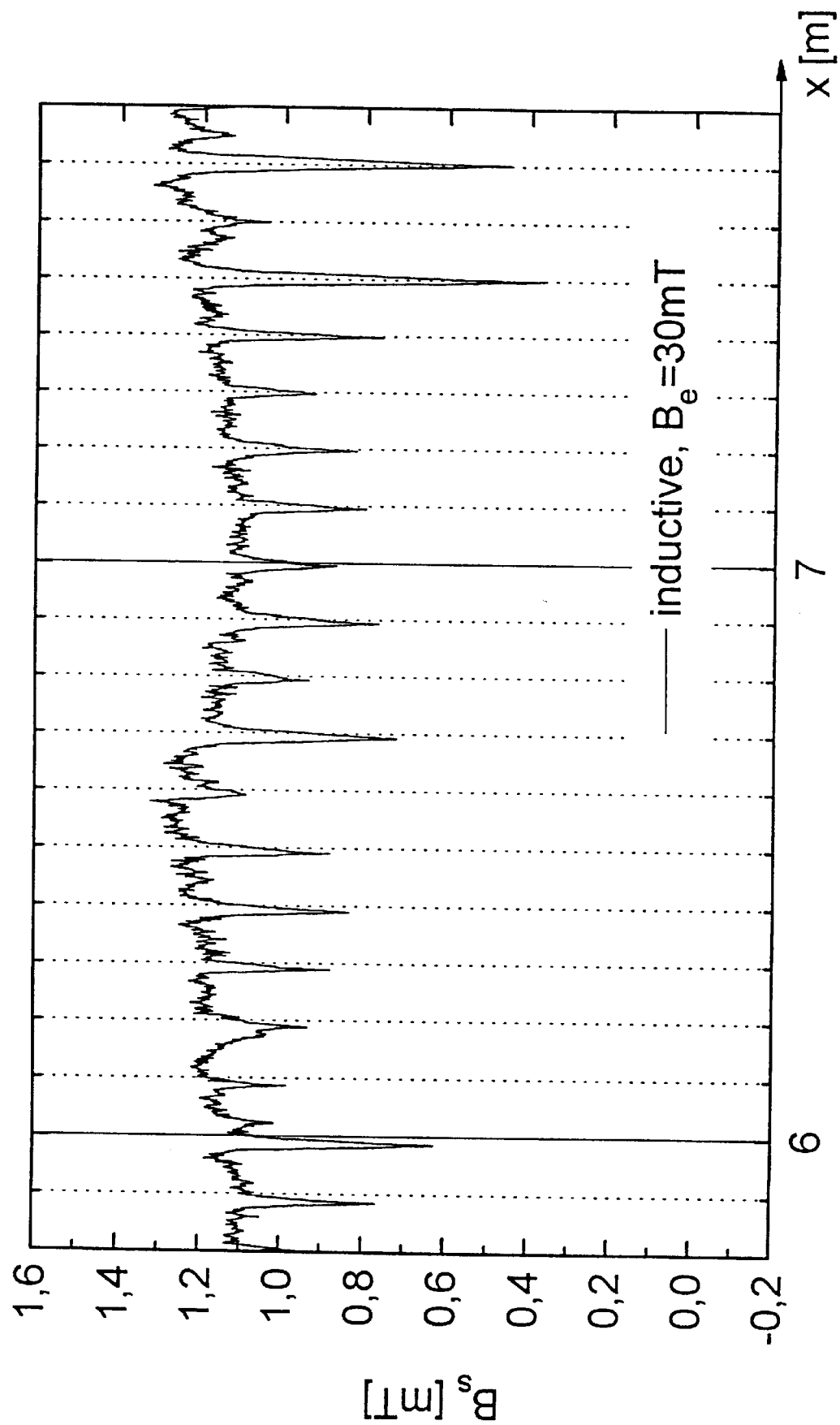
FIG. 2 is a diagram of locally periodic defect structure in a Bi-2223 superconductor tape, recorded with the method of the invention.

FIG. 2 shows the sectional recording of a very long superconducting tape Bi-2223, which was subjected to the TACHO measuring method. Field breakdowns here occur with a regularity of approximately a 10 cm periodic length and are more or less distinctive. It is thus initially possible to make a qualitative statement on the course of the longitudinal homogeneity of the critical current density $j_c$ (x), which can be specified quantitatively via a resistive calibration. It can then be decided whether the desired value for the critical current density $j_c$ falls short or not.

Figure 3:
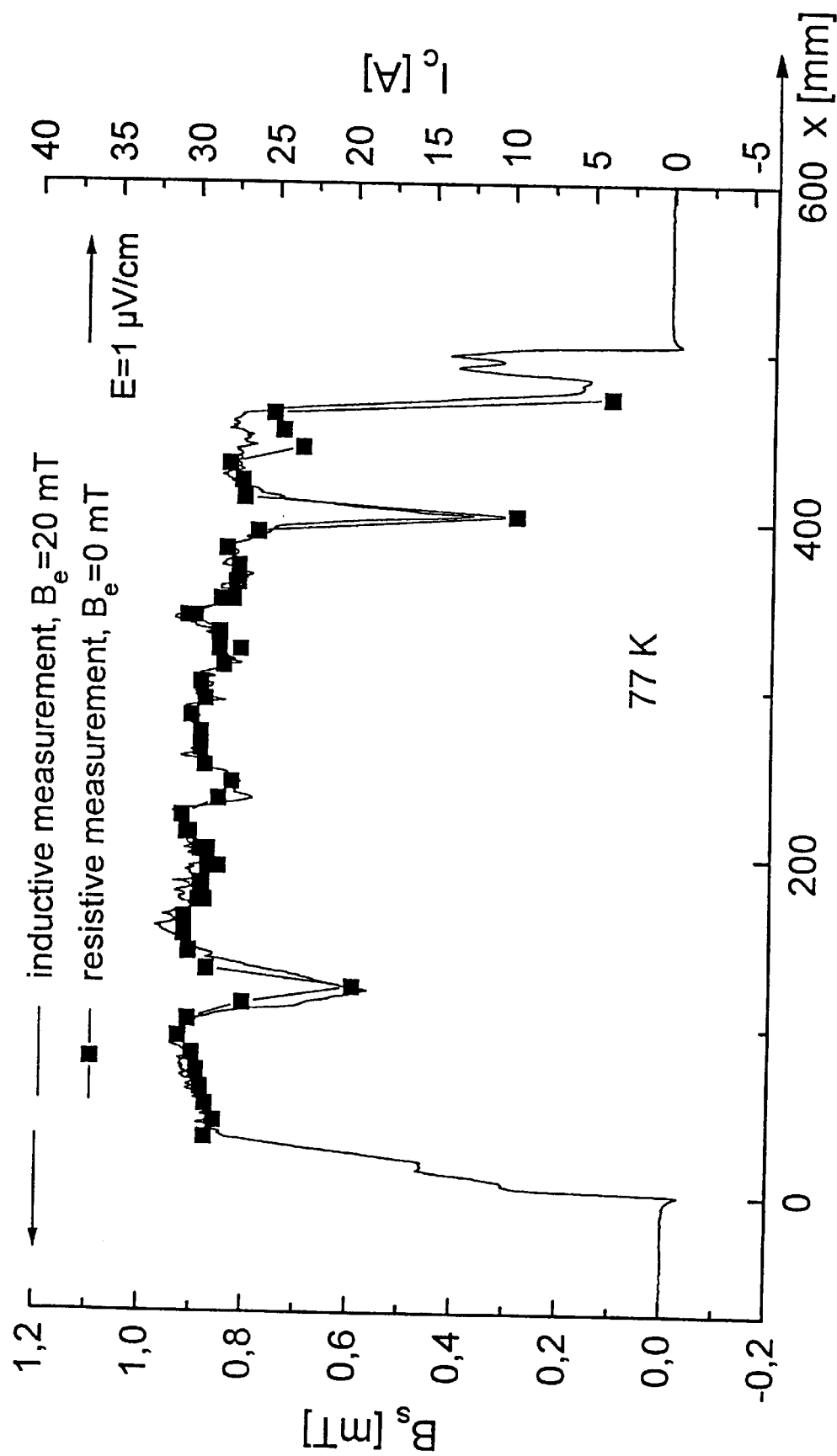
FIG. 3 is a diagram of inductively and resistively detected tape defects with resistive current calibration.

FIG. 3 shows a measured section of approximately one half meter of a Bi-2223 superconductor tape. The left ordinate provides the Hall probe signal in mT (inductive signal), while the right one provides the corresponding current-carrying capacity of the tape in Amps for 1 $\mu$V/cm electric field criterion (resistive calibration). In this case, the contactless, inductive measuring method was contrasted with the contacting, resistive measuring method. The efficiency of the inductive method is demonstrated through the coincidence of the $j_c$ (x) course, as is shown, with the course of the resistive measuring curve.

In order to prove that inductive measuring method is reliable, an optional section of the Bi-2223 tape of approximately 0.5 m length was subjected to the measuring method for determining the longitudinal homogeneity during a passage back and forth. FIG. 4 shows the measurement of the magnetic field course B in mT. The mirror-symmetrical course for the return passage measurement manifests itself exactly.

Figure 5:
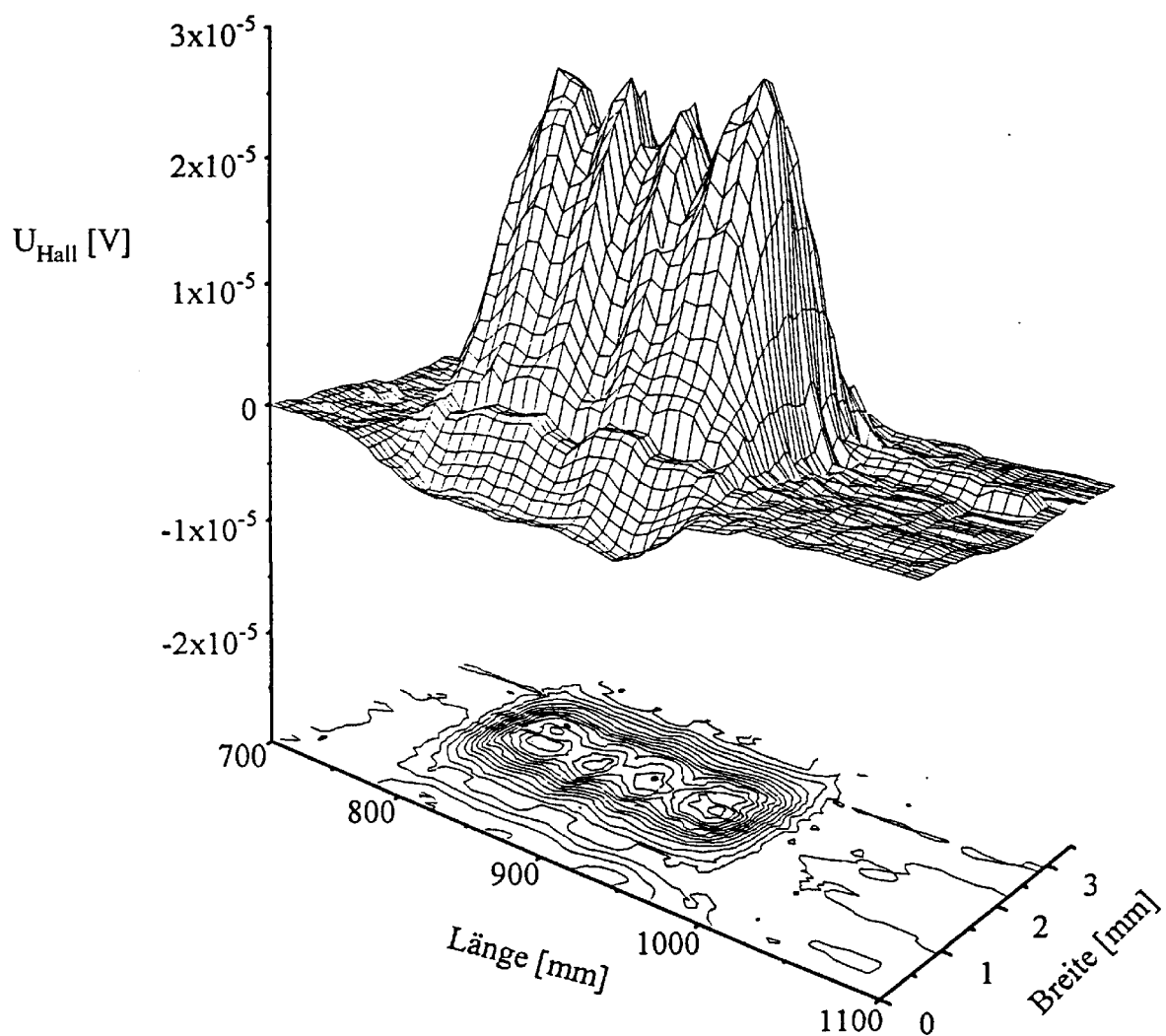
FIG. 5 is a diagram showing a recording of longitudinal and transverse homogeneity of the Hall signal in a Bi-2223 tape with a Hall probe array.

In the final analysis, the goal to be reached with the TACHO method is the simultaneous determination of the longitudinal and the transverse homogeneity with the aid of the Hall probe array 5a that is positioned crosswise to the longitudinal axis of the conductor, as sketched in FIG. 1d. By showing the current density over the conductor cross section and over the conductor length, it is possible to make an exact statement concerning the quality of the superconductor tape. With respect to this, FIG. 5 shows a three-dimensional recording of the Hall voltage course and below that its projection as a contour line representation over a Bi-2223 tape length of approximately 20 cm. The "Hall voltage mountain" shown therein is determined by the course of the current density for the tape conductor segment in longitudinal and transverse direction.

The principle of measurement is the same if the liquid nitrogen operated copper split-coil is replaced by a permanent or a superconducting magnet. In the latter case, more sophisticated cryogenic equipment is needed due to helium cooling, in the former a suitable geometrical shaping of the pole pieces of the permanent magnet is necessary.

The invention has been described in detail with respect to preferred embodiments, and it will now be apparent from the foregoing to those skilled in the art, the changes and modifications may be made without departing from the invention in its broader aspects, and the invention, therefore, as defined in the appended claims, is intended to cover all such changes and modifications as to fall within the true spirit of the invention.

What is claimed is:

1. A method using Hall probes for contactless, longitudinal and transversal homogeneity examination of a critical current density $j_c$ in a superconductor tape that is cooled to below a transition temperature $T_c$, comprising the steps of:

pulling the cooled superconductor tape through an external, locally limited magnetic field B (x, y, z) that has a constant gradient and a fixed magnetic field axis;

scanning a magnetic field generated by a screening current induced in a region of the superconductor tape penetrated by the external magnetic field using a first Hall probe at a distance of a few tenths of millimeters to the superconductor tape, the first Hall probe producing a first Hall probe signal representing the scanned magnetic field;

measuring the external magnetic field outside of a field range of the induced screening current with a second Hall probe which produces a second Hall probe signal representative of the measured external magnetic field;

using a compensated difference between the first and second Hall probe signals as a qualitative measure for a critical current density $j_c(x)$ and its longitudinal homogeneity which varies locally with respect to a longitudinal axis of the superconductor tape;

forming the compensated difference by adjusting a test difference between the two Hall probe signals to zero as a result of measuring the external magnetic field by both Hall probes in a dummy measurement conducted without the superconductor tape; and specifying quantitative locally critical current densities $j_c$ (x, y) from the Hall probe signals by a resistive calibration obtained from a current-voltage measurement.

2. The method according to claim 1, and further including the step of measuring a transverse homogeneity with a linear Hall probe array that is positioned crosswise to the longitudinal axis of the superconductor tape and extends broadside over the superconductor tape after all Hall probes in the array have first been adjusted to zero with a signal from the second probe.

3. The method according to claim 1, including aligning the longitudinal axis for the external magnetic field so that the longitudinal axis stands perpendicular on the broadside of the superconductor tape and intersects with the longitudinal axis of the superconductor tape.

4. The method according to claim 1, wherein the step of measuring the external magnetic field with the second Hall probe includes locating the second Hall probe at a predetermined location so that it is not influenced by the magnetic field of the superconductor tape.

5. The method according to claim 1, wherein the second Hall probe has a substantially identical design as the first Hall probe.

6. An apparatus for contactless, longitudinal and transversal homogeneity examination of a critical current density $j_c$ in a superconductor tape that is cooled to below a transition temperature, comprising:

- a cryostat that can be filled with a cooling agent for adjusting and maintaining a temperature necessary for superconducting operation;
- a magnet located inside the cryostat and having two poles separated by a gap through which the superconductor tape can be pulled;
- a guide in a region of the gap for positioning the superconductor tape in the gap;
- two reversing rolls disposed inside the cryostat and being dimensioned and installed so that the superconductor tape is transferred to and taken up, undamaged, from the guide;
- a first Hall probe in the region of the gap between the poles of the magnet for detecting the magnetic field generated by a screening current induced in the superconductor tape by the magnet;
- a second Hall probe in the magnetic field generated by the magnet and located outside of the magnetic field generated by the induced screening current; and
- a roll arrangement outside of the cryostat having a controllable angular velocity so that, in the region between poles of the magnet, the superconductor tape to be examined has a predetermined constant speed when moving in either a forward or backward direction.

7. The apparatus according to claim 6, and further including a linear array of Hall probes installed crosswise to a longitudinal axis and parallel to a broadside of the superconductor tape to be pulled through the gap between the poles of the magnet.

8. The apparatus according to claim 7, wherein the linear array includes the first Hall probe.

9. The apparatus according to claim 8, wherein the Hall probes each comprise a miniature Hall probe which has an active surface of no more than 100 $\mu$m×100 $\mu$m.

10. The apparatus according to claim 6, further including means for sensing a position of the superconductor tape in the gap and for transmitting a signal representing the position.

11. The apparatus according to claim 10, wherein the Hall probe comprises a miniature Hall probe which has an active surface of no more than 100 $\mu$m×100 $\mu$m.

12. The apparatus according to claim 6, further including a lid closing the cryostat and two guides on the lid which guide the superconductor tape into and from the cryostat.

13. The apparatus according to claim 6, wherein the magnet for generating the external magnetic field comprises a permanent magnet.

14. The apparatus according to claim 6, wherein the magnet for generating the external magnetic field comprises one of a normal conducting and a superconducting electromagnet including means for selecting a strength of the magnetic field and for adjusting the magnetic field so that it is constant in time.

15. The apparatus according to claim 6, wherein the magnet comprises a split-coil solenoid.

* * * * *